ized Patent No.: US 8,796,134 B2

(12) United States Patent
Kim et al.

(10) Patent No.: US 8,796,134 B2
(45) Date of Patent: Aug. 5, 2014

(54) METHODS OF FORMING INTEGRATED CIRCUIT DEVICES USING MODIFIED RECTANGULAR MASK PATTERNS TO INCREASE RELIABILITY OF CONTACTS TO ELECTRICALLY CONDUCTIVE LINES (75) Inventors: Chang-Hwa Kim, Hwaseong-si (KR); Ryan L. Burns, Wappingers Falls, NY (US)

(73) Assignees: Samsung Electronics Co., Ltd. (KR); International Business Machines Corporation, Armonk, NY (US)

( * ) Notice: Subject to any disclaimer, the term of this patent is extended or adjusted under 35 U.S.C. 154(b) by 190 days.

(21) Appl. No.: 13/397,038

(22) Filed: Feb. 15, 2012

(65) Prior Publication Data

US 2013/0210223 A1  Aug. 15, 2013

(51) Int. Cl.
*H01L 21/4763* (2006.01)
*H01L 21/302* (2006.01)

(52) U.S. Cl.
USPC .......................................... 438/618; 438/689

(58) Field of Classification Search
None
See application file for complete search history.

(56) References Cited

U.S. PATENT DOCUMENTS

| 6,787,469 | B2 | 9/2004 | Houston et al. |
| 2001/0006245 | A1* | 7/2001 | Yunogami et al. ............ 257/513 |
| 2007/0161190 | A1* | 7/2007 | Park et al. ..................... 438/257 |
| 2008/0188080 | A1* | 8/2008 | Furukawa et al. ............ 438/694 |
| 2009/0068837 | A1 | 3/2009 | Colburn et al. |

FOREIGN PATENT DOCUMENTS

KR  10-0554514  6/2005

\* cited by examiner

*Primary Examiner* — Scott B Geyer
(74) *Attorney, Agent, or Firm* — Myers Bigel Sibley & Sajovec, PA (57) ABSTRACT Methods of forming integrated circuit devices include forming first and second electrically conductive lines at side-by-side locations on an integrated circuit substrate. Steps are performed to selectively etch each of the first and second electrically conductive lines into a respective pair of interconnects having facing ends that are separated from each other. This selective etching step is performed using a photolithography mask having a modified-rectangular mask pattern thereon, which is configured to define a shape of the facing ends of each of the pair of interconnects.

20 Claims, 11 Drawing Sheets

METHODS OF FORMING INTEGRATED CIRCUIT DEVICES USING MODIFIED RECTANGULAR MASK PATTERNS TO INCREASE RELIABILITY OF CONTACTS TO ELECTRICALLY CONDUCTIVE LINES

FIELD

The present invention relates to methods of forming integrated circuit devices and, more particularly, to methods of forming integrated circuit devices having highly integrated contacts therein.

BACKGROUND

Figure 1A:
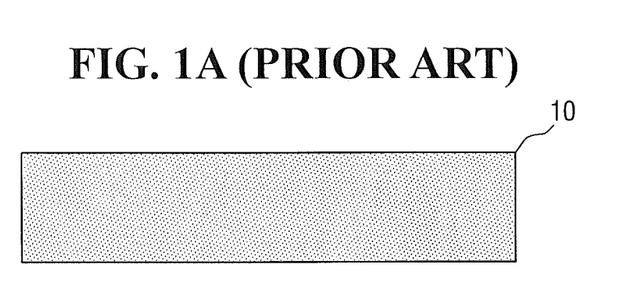
FIG. 1A is a plan view of a rectangular mask pattern according to the prior art.

Techniques to form highly integrated circuits frequently use multi-level electrical interconnects to provide electrical connections between individual devices within logic gates and other active components within integrated circuits. Conventional techniques to form electrical interconnects can include dividing electrically conductive line segments (e.g., polysilicon line segments) into respective electrical interconnects to achieve high integration density. For example, FIG. 1A illustrates a rectangular mask pattern 10 that may be provided on a photolithography mask. This mask pattern 10 may be used during a photolithography process to pattern a layer of photoresist material on an integrated circuit substrate.

Figure 1B:
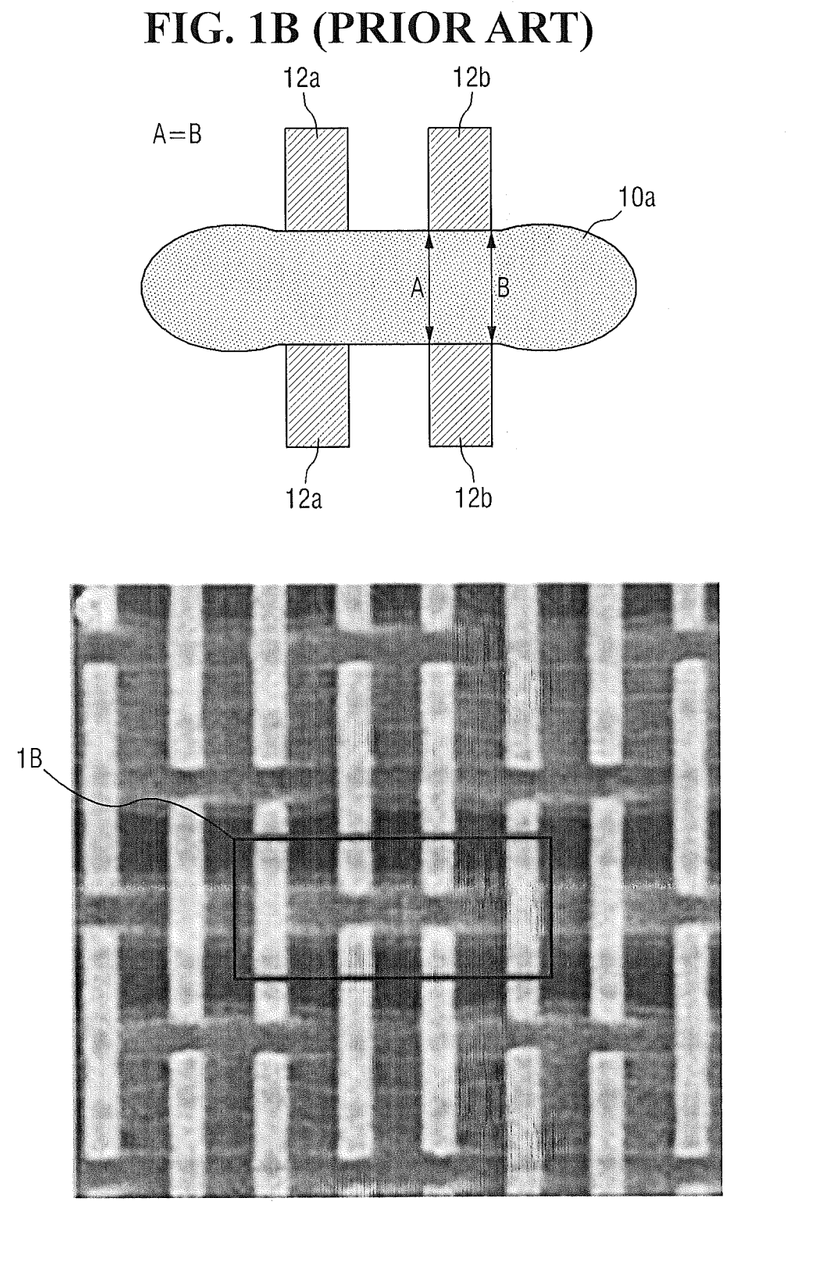
FIG. 1B illustrates how the rectangular mask pattern of FIG. 1A may translate into a patterned layer of photoresist material, which may be used to pattern electrically conductive line segments (shown by highlighted region 1B) according to the prior art.
Figure 1C:
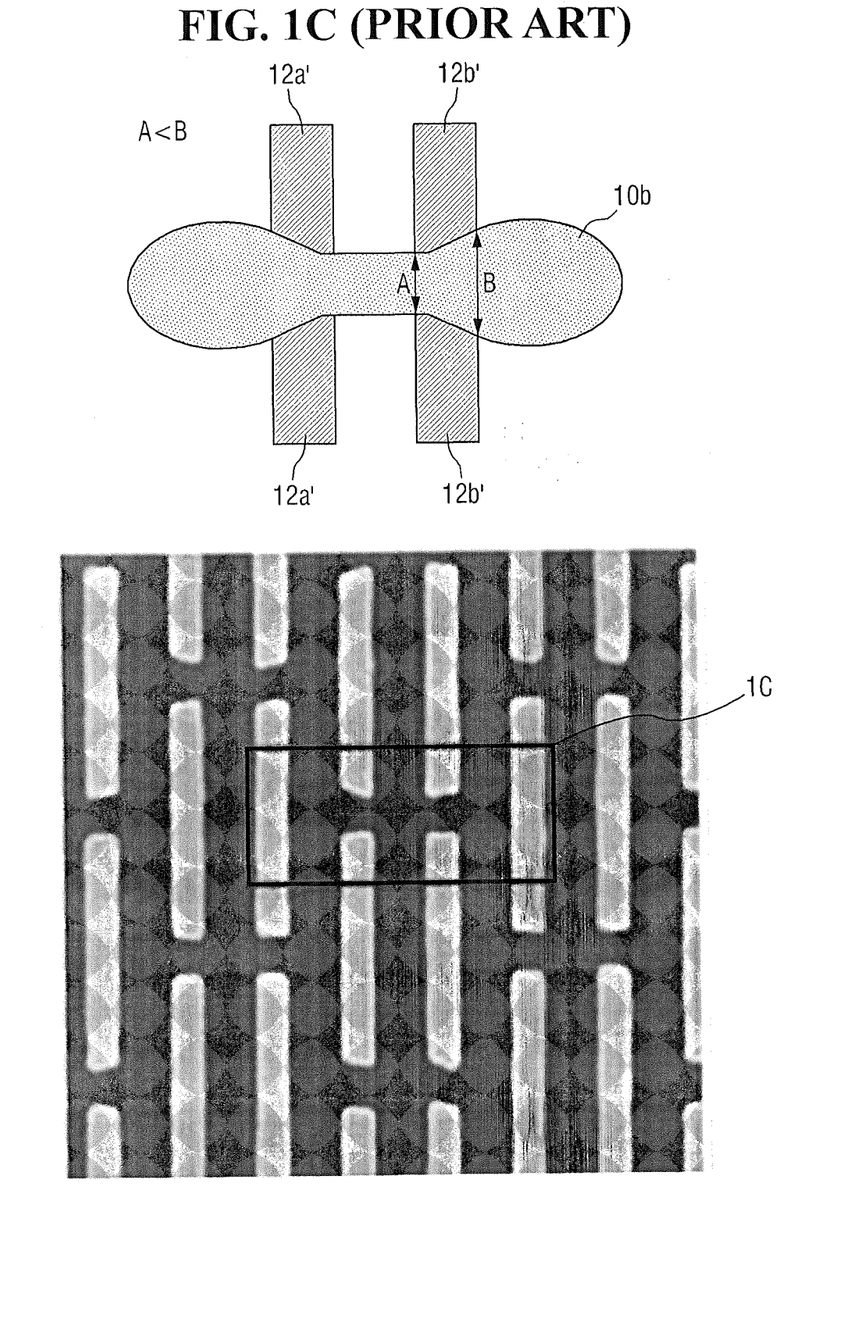
FIG. 1C illustrates how the rectangular mask pattern of FIG. 1A may translate into a patterned layer of photoresist material, which may be used to pattern electrically conductive line segments (shown by highlighted region 1C) according to the prior art.

As illustrated by FIG. 1B, a patterned layer of photoresist material 10a within highlighted region 1B, which may have a generally rectangular shape derived from the shape of the mask pattern 10, may be utilized to break parallel electrically conductive line segments 12a, 12b (e.g., polysilicon lines) into respective pairs of electrical interconnects, which may be independently contacted during subsequent process steps using vertical interconnect techniques that may form electrically conductive "plugs" within interlayer insulating layers. In particular, FIG. 1B demonstrate ,that when the dimensions A and B within the patterned layer of photoresist material 10a are equal, the electrically conductive line segments 12a, 12b may be cut relatively cleanly so that opposing ends of the pairs of electrical interconnects may have faces that intersect at approximately perpendicular angles with the sides of the interconnects. In contrast, FIG. 1C demonstrates that when the dimension A is less than the dimension B within a patterned layer of photoresist material 10b highlighted by region 1C, the electrically conductive line segments 12a', 12b' may be cut nonuniformly with ends extending at acute or obtuse angles relative to each other. As will be understood by those skilled in the art, when the dimension B is greater than the dimension A, it may be more difficult to reliably contact the ends of the interconnects with vertically-extending interconnects (e.g., vertical "plugs"), which are formed during subsequent process steps.

SUMMARY

Methods of forming integrated circuit devices according to embodiments of the invention include forming first and second electrically conductive lines in parallel at side-by-side locations on an integrated circuit substrate. Steps are performed to selectively etch each of the first and second electrically conductive lines into at least one pair of interconnects having facing ends that are separated from each other. This selective etching step is performed using a photolithography mask having a modified-rectangular mask pattern thereon, which is configured to indirectly define a shape of the facing ends of each of the pair of interconnects via direct patterning of a photoresist mask material. In particular, the selective etching step may include patterning a layer of photoresist material using the photolithography mask to selectively expose portions of the layer of photoresist material to light followed by removal of the exposed (or unexposed) portions. This layer of photoresist material may be deposited to cover the first and second electrically conductive lines (e.g., polysilicon lines), which are then selectively etched using the patterned layer of photoresist material as an etching mask.

This modified-rectangular mask pattern may include a rectangular-shaped primary mask pattern, which has first sides of a first length and second sides of a second length less than the first length, and a first rectangular-shaped secondary mask pattern, which extends on a first side of the rectangular-shaped primary mask pattern. This first rectangular-shaped secondary mask pattern may have third sides of a third length less than the first length and fourth sides of a fourth length less than the third length. In some embodiments of the invention, the second and fourth lengths are equivalent (e.g., the width of primary mask pattern equals a width of the first rectangular-shaped secondary mask pattern).

According to still further embodiments of the invention, the first rectangular-shaped secondary mask pattern is centered on the first side of the rectangular-shaped primary mask pattern. In addition, the modified-rectangular mask pattern may further include a second rectangular-shaped secondary mask pattern, which may have the same dimensions as the first rectangular-shaped secondary mask pattern. This second rectangular-shaped secondary mask pattern may be positioned on the first side of the rectangular-shaped primary mask pattern (e.g., at an opposing end relative to the first rectangular-shaped secondary mask pattern) or the rectangular-shaped primary mask pattern may be sandwiched between the first and second rectangular-shaped secondary mask patterns. According to still further embodiments of the invention, a third rectangular-shaped secondary mask pattern may be provided, which is centered on the second side of the rectangular-shaped primary mask pattern, along with the first and second rectangular-shaped secondary mask patterns, which are positioned on opposing ends of the first side of the rectangular-shaped primary mask pattern.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
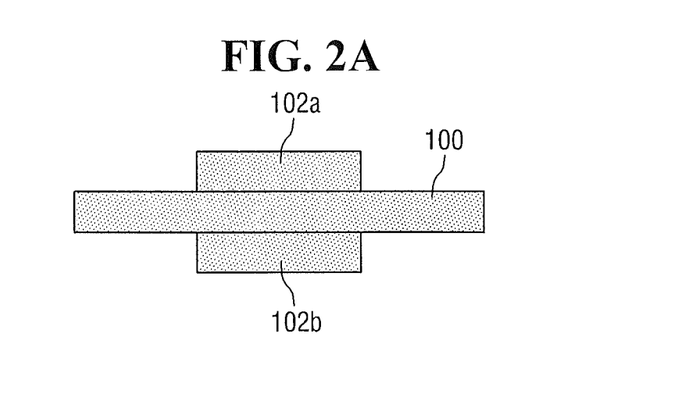
FIG. 2A illustrates is a plan view of a modified-rectangular mask pattern, which may be used to pattern electrically conductive line segments, according to an embodiment of the present invention.

FIG. 2A illustrates methods of forming integrated circuit devices according to an embodiment of the invention, which includes forming first and second electrically conductive lines 112a, 112b, which extend in parallel at side-by-side locations on an underlying integrated circuit substrate. Steps are performed to selectively etch each of the first and second electrically conductive lines 112a, 112b into a respective pair of interconnects having facing ends that are separated from each other. This selective etching step is performed using a photolithography mask having a modified-rectangular mask pattern thereon. This modified-rectangular mask pattern is configured to define a photoresist pattern 104a on an underlying substrate, which is then used during an etching step to pattern the underlying electrically conductive lines 112a, 112b (e.g., polysilicon line segments) and thereby define the shape of the facing ends of each of the pair of interconnects, where A>>B at the facing ends. The modified-rectangular mask pattern may include a rectangular-shaped primary mask pattern 100, which has first sides of a first length (length) and second sides of a second length (width) less than the first length. A first rectangular-shaped secondary mask pattern 102a is provided, which extends on a first side of the rectangular-shaped primary mask pattern 100. This first rectangular-shaped secondary mask pattern 102a has third sides of a third length (length) less than the first length and fourth sides of a fourth length (width) less than the third length. In some embodiments of the invention, the second and fourth lengths are equivalent (e.g., the width of pattern 100 equals the width of pattern 102*a*). As shown by FIG. 2A, the first rectangular-shaped secondary mask pattern 102*a* is centered on the first side of the rectangular-shaped primary mask pattern 100. The modified-rectangular mask pattern may further include a second rectangular-shaped secondary mask pattern 102*b*, which may have the same dimensions as the first rectangular-shaped secondary mask pattern 102*a*. The rectangular-shaped primary mask pattern 100 may be sandwiched between the first and second rectangular-shaped secondary mask patterns 102*a*, 102*b*, so that during photolithographic patterning of a photoresist mask material layer, a photoresist pattern 104*a* may be formed, which covers the first and second electrically conductive lines 112*a*, 112*b*. The dimension A on the photoresist pattern is substantially greater than dimension B in order to provide sufficient separation between the facing ends of each of the pair of interconnects (to thereby prevent undesired shorting between the ends), yet also increase the available area at the ends for contacting subsequently formed and closely spaced-apart vertical interconnects (e.g., conductive plugs), which may be provided within highly integrated circuits such as memory cells (e.g., DRAM, SRAM cells, etc.).

Figure 2B:
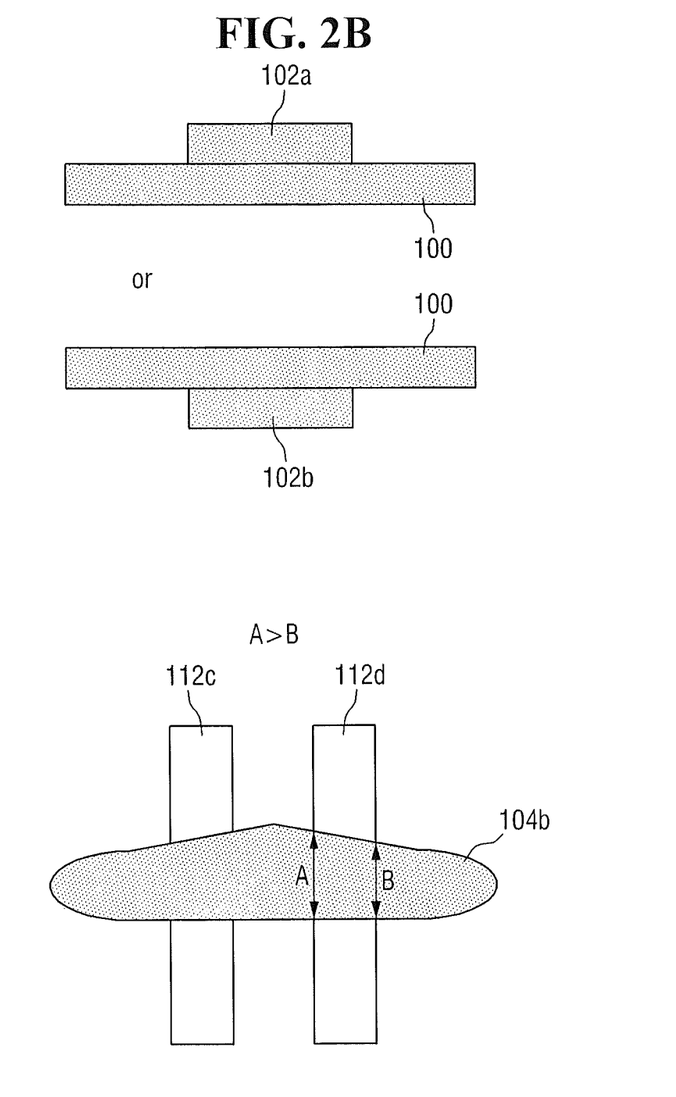
FIG. 2B illustrates is a plan view of a modified-rectangular mask pattern, which may be used to pattern electrically conductive line segments, according to an embodiment of the present invention.

FIG. 2B illustrates methods of forming integrated circuit devices according to another embodiment of the invention, which includes forming first and second electrically conductive lines 112*c*, 112*d*, which extend in parallel at side-by-side locations on an underlying integrated circuit substrate. Steps are performed to selectively etch each of the first and second electrically conductive lines 112*c*, 112*d* into a respective pair of interconnects having facing ends that are separated from each other. This selective etching step is performed using a photolithography mask having a modified-rectangular mask pattern thereon. This modified-rectangular mask pattern is configured to define a photoresist pattern 104*b* on an underlying substrate, which is then used during an etching step to pattern the underlying electrically conductive lines 112*c*, 112*d* and thereby define the shape of the facing ends of each of the pair of interconnects, where A>B at the facing ends. The modified-rectangular mask pattern may include a rectangular-shaped primary mask pattern 100, which has first sides of a first length (length) and second sides of a second length (width) less than the first length. A rectangular-shaped secondary mask pattern 102*a* (or 102*b*) is provided, which extends on a first side (or second side) of the rectangular-shaped primary mask pattern 100. This rectangular-shaped secondary mask pattern 102*a* (or 102*b*) has third sides of a third length (length) less than the first length and fourth sides of a fourth length (width) less than the third length. In some embodiments of the invention, the second and fourth lengths are equivalent (e.g., the width of pattern 100 equals the width of patterns 102*a* or 102*b*). As shown by FIG. 2B, the rectangular-shaped secondary mask pattern 102*a* (or 102*b*) is centered on the first side (or second side) of the rectangular-shaped primary mask pattern 100, so that during photolithographic patterning of a photoresist mask material layer, a photoresist pattern 104*b* may be formed, which covers the first and second electrically conductive lines 112*c*, 112*d*. The dimension A on the photoresist pattern is somewhat greater than dimension B in order to provide sufficient separation between the facing ends of each of the pair of interconnects (to thereby prevent undesired shorting between the ends), yet also increase the available area at the ends for contacting subsequently formed and closely spaced-apart vertical interconnects (e.g., conductive plugs), which may be provided within highly integrated circuits such as memory cells (e.g., DRAM, SRAM cells, etc.). This photoresist pattern 104*b* of FIG. 2B may have advantages relative to the mask patterns 10*a*, 10*b* of FIGS. 1B-1C, but is likely less preferred relative to the mask pattern 104*a* of FIG. 2A, where A>>B.

Figure 2C:
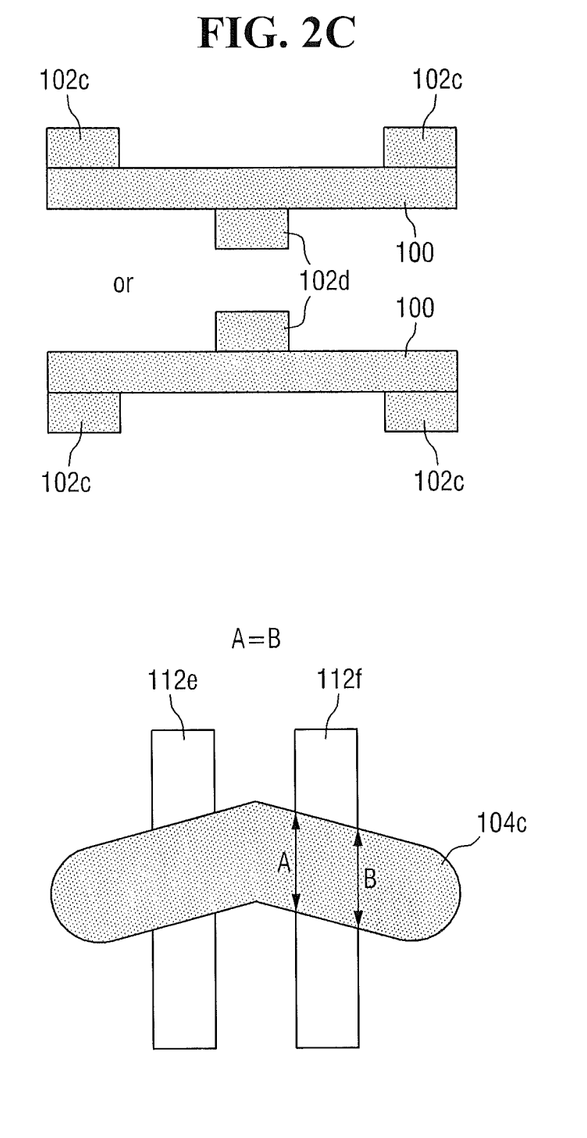
FIG. 2C illustrates is a plan view of a modified-rectangular mask pattern, which may be used to pattern electrically conductive line segments, according to an embodiment of the present invention.

FIG. 2C illustrates methods of forming integrated circuit devices according to an embodiment of the invention, which includes forming first and second electrically conductive lines 112*e*, 112*f*, which extend in parallel at side-by-side locations on an underlying integrated circuit substrate. Steps are performed to selectively etch each of the first and second electrically conductive lines 112*e*, 112*f* into a respective pair of interconnects having facing ends that are separated from each other. This selective etching step is performed using a photolithography mask having a modified-rectangular mask pattern thereon. This modified-rectangular mask pattern is configured to define a photoresist pattern 104*c* on an underlying substrate, which is then used during an etching step to pattern the underlying electrically conductive lines 112*e*, 112*f* and thereby define the shape of the facing ends of each of the pair of interconnects, where A=B at the facing ends. The modified-rectangular mask pattern may include a rectangular-shaped primary mask pattern 100, which has first sides of a first length (length) and second sides of a second length (width) less than the first length. First and second rectangular-shaped secondary mask patterns 102*c* are provided, which extend on a first side of the rectangular-shaped primary mask pattern 100 and are located at opposite ends thereof. A third rectangular-shaped secondary mask pattern 102*d* is provided, which is centered on a second side of the rectangular-shaped primary mask pattern 100. The rectangular-shaped primary mask pattern 100 may be sandwiched between the first and second rectangular-shaped secondary mask patterns 102*c* and the third rectangular-shaped secondary mask pattern 102*d*, so that during photolithographic patterning of a photoresist mask material layer, a photoresist pattern 104*c* may be formed, which covers the first and second electrically conductive lines 112*e*, 112*f*.

Figure 2D:
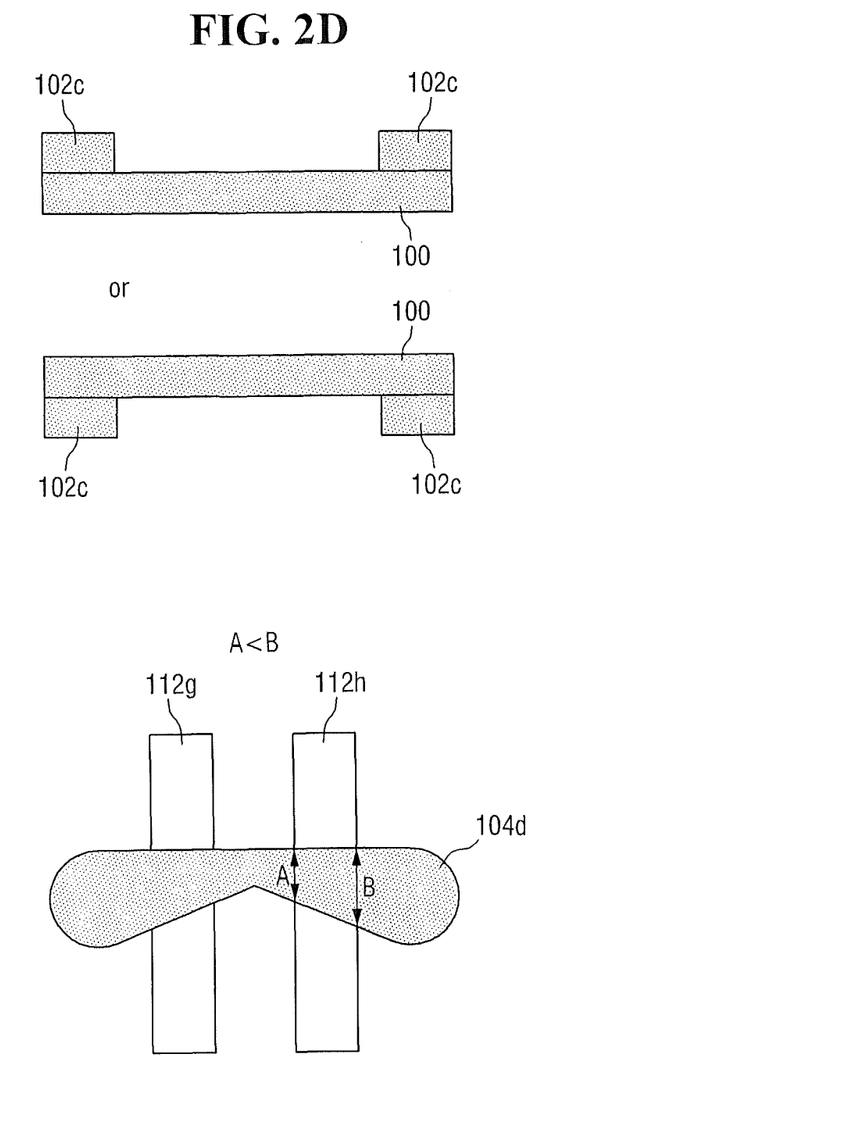
FIG. 2D illustrates is a plan view of a modified-rectangular mask pattern, which may be used to pattern electrically conductive line segments, according to an embodiment of the present invention.

FIG. 2D illustrates methods of forming integrated circuit devices according to an embodiment of the invention, which includes forming first and second electrically conductive lines 112*g*, 112*h*, which extend in parallel at side-by-side locations on an underlying integrated circuit substrate. Steps are performed to selectively etch each of the first and second electrically conductive lines 112*g*, 112*h* into a respective pair of interconnects having facing ends that are separated from each other. This selective etching step is performed using a photolithography mask having a modified-rectangular mask pattern thereon. This modified-rectangular mask pattern is configured to define a photoresist pattern 104*d* on an underlying substrate, which is then used during an etching step to pattern the underlying electrically conductive lines 112*g*, 112*h* and thereby define the shape of the facing ends of each of the pair of interconnects, where A<B at the facing ends. The modified-rectangular mask pattern may include a rectangular-shaped primary mask pattern 100, which has first sides of a first length (length) and second sides of a second length (width) less than the first length. First and second rectangular-shaped secondary mask patterns 102*c* are provided, which extend on a first side of the rectangular-shaped primary mask pattern 100 and are located at opposite ends thereof. The rectangular-shaped primary mask pattern 100 and the secondary mask patterns 102*c* may be configured so that during photolithographic patterning of a photoresist mask material layer, a photoresist pattern 104*d* may be formed, which covers the first and second electrically conductive lines 112*g*, 112*h*. This photoresist pattern 104*d* may have advantages relative to the mask pattern 10b of FIG. 10, but is likely less preferred relative to the mask patterns of FIGS. 2A-2C.

Figure 3A:
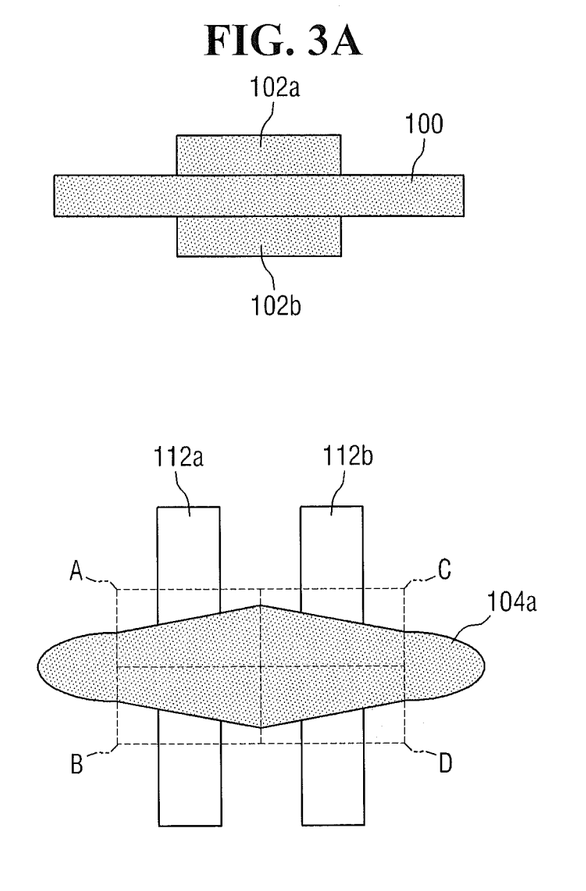
FIG. 3A illustrates is a plan view of a modified-rectangular mask pattern, which may be used to pattern electrically conductive line segments, according to an embodiment of the present invention.
Figure 3B:
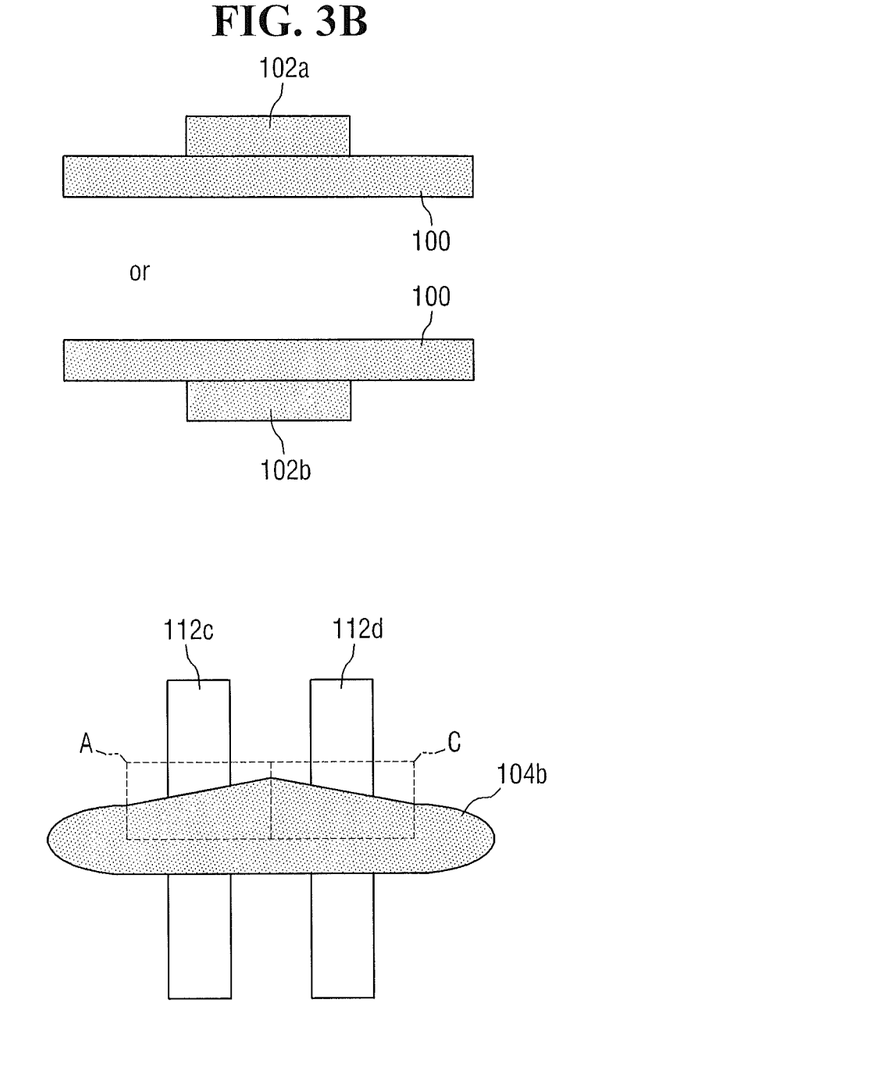
FIG. 3B illustrates is a plan view of a modified-rectangular mask pattern, which may be used to pattern electrically conductive line segments, according to an embodiment of the present invention.
Figure 3C:
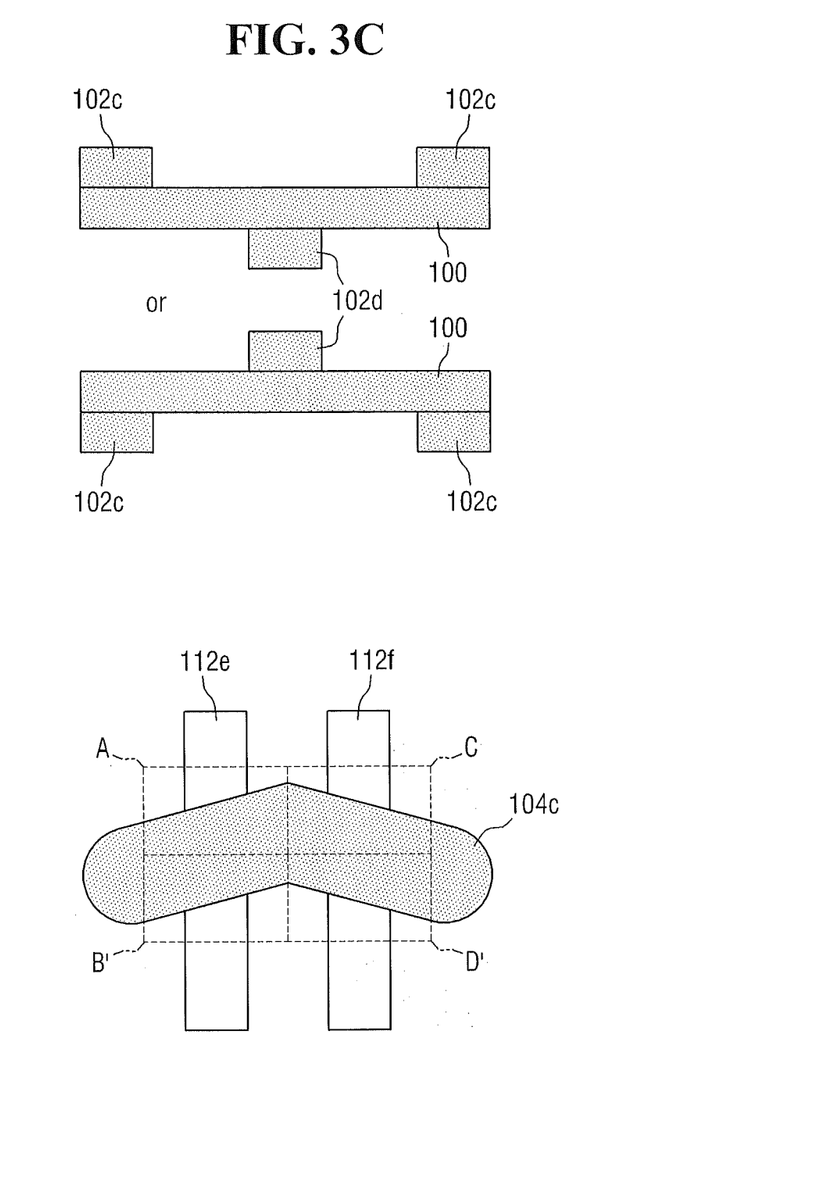
FIG. 3C illustrates is a plan view of a modified-rectangular mask pattern, which may be used to pattern electrically conductive line segments, according to an embodiment of the present invention.
Figure 3D:
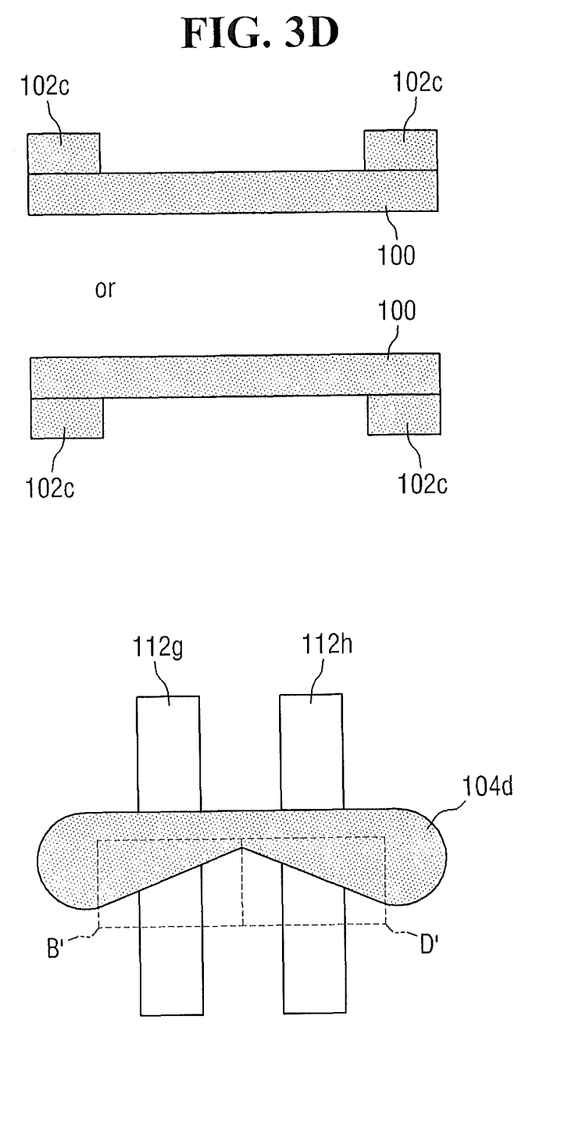
FIG. 3D illustrates is a plan view of a modified-rectangular mask pattern, which may be used to pattern electrically conductive line segments, according to an embodiment of the present invention.

Referring now to FIGS. 2A and 3A, the combination of the rectangular mask patterns 100, 102a and 102b into a modified-rectangular mask pattern may be utilized advantageously to define a photoresist pattern 104a. This photoresist pattern 104a may be used during a wet etching step to pattern first and second electrically conductive lines 112a, 112b into respective pairs of interconnects having facing edges (within regions A-D), which are disposed at angles relative to each other. These facing edges may be spaced sufficiently to avoid undesired shorting (through electrical bridging between the ends), yet disposed at angles that increase the effective contact area in the event closely-spaced vertical interconnects (e.g., electrical plugs) are utilized to electrically contact one or more of the ends of the interconnects within regions A-D. Referring now to FIGS. 2B and 3B, the combination of the rectangular mask patterns 100 and 102a (or 102b) may be utilized advantageously to define a photoresist pattern 104b. This photoresist pattern 104b may be used during a wet etching step to pattern first and second electrically conductive lines 112c, 112c into respective pairs of interconnects having facing edges (within regions A and C), which are disposed at angles relative to generally flat ends. These facing edges may be spaced sufficiently to avoid undesired shorting (through electrical bridging between the ends), yet disposed at angles that increase the effective contact area in the event closely-spaced vertical interconnects (e.g., electrical plugs) are utilized to electrically contact one or more of the ends of the interconnects within regions A and C. Referring now to FIGS. 2C and 3C, the combination of the rectangular mask patterns 100, 102c and 102d may be utilized advantageously to define a photoresist pattern 104c. This photoresist pattern 104c may be used during a wet etching step to pattern first and second electrically conductive lines 112e, 112f into respective pairs of interconnects having facing edges (within regions A, B', C and D'), which are disposed at angles relative to each other. These facing edges may be spaced sufficiently to avoid undesired shorting (through electrical bridging between the ends), yet disposed at angles that increase the effective contact area in the event closely-spaced vertical interconnects (e.g., electrical plugs) are utilized to electrically contact one or more of the ends of the interconnects within regions A and C. Referring now to FIGS. 2D and 3D, the combination of the rectangular mask patterns 100 and 102c may be utilized advantageously to define a photoresist pattern 104d. This photoresist pattern 104d may be used during a wet etching step to pattern first and second electrically conductive lines 112g, 112h into respective pairs of interconnects having facing edges (within regions B' and D'), which are disposed at angles relative to opposing faces. As described above with respect to FIG. 2D, this photoresist pattern 104d may have advantages relative to the mask pattern 10b of FIG. 1C, but is likely less preferred relative to the mask patterns of FIGS. 2A-2C and 3A-3C.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit device, comprising:
    forming first and second electrically conductive line segments that extend in parallel at side-by-side locations on a substrate; and
    selectively etching each of the first and second line segments into a respective pair of electrical interconnects having facing ends that are separated from each other, using a photolithography mask having a modified-rectangular mask pattern thereon configured to define a shape of the facing ends of each of the pair of electrical interconnects, said modified-rectangular mask pattern comprising a composite of:
        a rectangular-shaped primary mask pattern having first sides of a first length and second sides of a second length less than the first length; and
        a first rectangular-shaped secondary mask pattern on a first side of said rectangular-shaped primary mask pattern, said first rectangular-shaped secondary mask pattern having third sides of a third length less than the first length and fourth sides of a fourth length less than the third length.

2. The method of claim 1, wherein said first rectangular-shaped secondary mask pattern is centered on the first side of said primary mask pattern.

3. The method of claim 2, wherein said modified-rectangular mask pattern further comprises a second rectangular-shaped secondary mask pattern having the same dimensions as the first rectangular-shaped secondary mask pattern; and wherein said primary mask pattern is sandwiched between the first and second rectangular-shaped secondary mask patterns.

4. The method of claim 2, wherein said modified-rectangular mask pattern further comprises a second rectangular-shaped secondary mask pattern; and wherein said primary mask pattern is sandwiched between the first and second rectangular-shaped secondary mask patterns.

5. The method of claim 1, wherein said modified-rectangular mask pattern further comprises a second rectangular-shaped secondary mask pattern having the same dimensions as the first rectangular-shaped secondary mask pattern, on the first side of said primary mask pattern.

6. The method of claim 5, wherein the first and second rectangular-shaped secondary mask patterns are located at opposing ends of the first side of said primary mask pattern.

7. The method of claim 6, wherein said modified-rectangular mask pattern further comprises a third rectangular-shaped secondary mask pattern; and wherein said primary mask pattern is sandwiched between the first and second rectangular-shaped secondary mask patterns on one side and the third rectangular-shaped secondary mask pattern on an opposing side.

8. The method of claim 7, wherein the third rectangular-shaped secondary mask pattern is centered on the opposing side.

9. The method of claim 1, wherein the second length equals the fourth length.

10. The method of claim 1, wherein said selectively etching comprises:
    patterning a layer of photoresist material using the photolithography mask to selectively expose portions of the layer of photoresist material; and
    etching the first and second electrically conductive line segments using the patterned layer of photoresist material as an etching mask.

11. The method of claim 1, wherein the first and second electrically conductive line segments comprise polysilicon.

12. A method of forming an integrated circuit device, comprising:
    forming an electrically conductive line segment on the substrate; and cutting the electrically conductive line segment into a pair of electrical interconnects having facing ends that are separated from each other, using a photolithography mask having a modified-rectangular mask pattern thereon configured to define a shape of the facing ends of the pair of electrical interconnects, said modified-rectangular mask pattern comprising a composite of:
- a rectangular-shaped primary mask pattern having first sides of a first length and second sides of a second length less than the first length; and
- a first rectangular-shaped secondary mask pattern on a first side of said rectangular-shaped primary mask pattern, said first rectangular-shaped secondary mask pattern having third sides of a third length less than the first length and fourth sides of a fourth length less than the third length.

13. The method of claim 12, wherein said first rectangular-shaped secondary mask pattern is centered on the first side of said primary mask pattern.

14. The method of claim 13, wherein said modified-rectangular mask pattern further comprises a second rectangular-shaped secondary mask pattern having the same dimensions as the first rectangular-shaped secondary mask pattern; and wherein said primary mask pattern is sandwiched between the first and second rectangular-shaped secondary mask patterns.

15. The method of claim 13, wherein said, modified-rectangular mask pattern further comprises a second rectangular-shaped secondary mask pattern; and wherein said primary mask pattern is sandwiched between the first and second rectangular-shaped secondary mask patterns.

16. The method of claim 12, wherein said modified-rectangular mask pattern further comprises a second rectangular-shaped secondary mask pattern having the same dimensions as the first rectangular-shaped secondary mask pattern, on the first side of said primary mask pattern.

17. The method of claim 16, wherein the first and second rectangular-shaped secondary mask patterns are located at opposing ends of the first side of said primary mask pattern.

18. The method of claim 17, wherein said modified-rectangular mask pattern further comprises a third rectangular-shaped secondary mask pattern; and wherein said primary mask pattern is sandwiched between the first and second rectangular-shaped secondary mask patterns on one side and the third rectangular-shaped secondary mask pattern on an opposing side.

19. The method of claim 18, wherein the third rectangular-shaped secondary mask pattern is centered on the opposing side.

20. The method of claim 12, wherein the second length equals the fourth length.

* * * * *